(12) United States Patent
Yang

(10) Patent No.: US 12,249,805 B2
(45) Date of Patent: Mar. 11, 2025

(54) FIXING BASE, LASER PROJECTION MODULE, AND ELECTRONIC DEVICE

(71) Applicant: VIVO MOBILE COMMUNICATION CO., LTD., Guangdong (CN)

(72) Inventor: Wanglai Yang, Guangdong (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 679 days.

(21) Appl. No.: 17/508,834

(22) Filed: Oct. 22, 2021

(65) Prior Publication Data

US 2022/0045477 A1 Feb. 10, 2022

Related U.S. Application Data

(63) Continuation-in-part of application No. PCT/CN2020/082812, filed on Apr. 1, 2020.

(30) Foreign Application Priority Data

Apr. 23, 2019 (CN) .......................... 201910329862.1

(51) Int. Cl.
*H01S 5/023* (2021.01)
*H01S 5/02253* (2021.01)
(Continued)

(52) U.S. Cl.
CPC ...... *H01S 5/02326* (2021.01); *H01S 5/02253* (2021.01); *H01S 5/0237* (2021.01); *H01S 5/02469* (2013.01)

(58) Field of Classification Search
CPC .. H01S 5/02257; H01S 5/023; H01S 5/02315; H01S 5/0239; H01S 5/02326
See application file for complete search history.

(56) References Cited

U.S. PATENT DOCUMENTS 5,136,152 A * 8/1992 Lee ....................... G11B 7/123
369/112.28
8,703,511 B2 * 4/2014 Matoba ................. H01L 33/486
438/26
(Continued)

FOREIGN PATENT DOCUMENTS

CN 202564781 U 11/2012
CN 102854632 A 1/2013
(Continued)

OTHER PUBLICATIONS

International Search Report of International Application No. PCT/CN2020/082812 mailed on Jun. 28, 2020.
(Continued)

*Primary Examiner* — Xinning (Tom) Niu
*Assistant Examiner* — Delma R Forde
(74) *Attorney, Agent, or Firm* — IP & T GROUP LLP

(57) ABSTRACT

A laser projection module includes a fixing base, a light-emitting chip and an optical element. The fixing base has a first surface and a second surface opposite each other, and the second surface is a light-emitting surface. The fixing base has a first accommodation cavity, a second accommodation cavity and a third accommodation cavity that are sequentially arranged in a direction from the first surface to the second surface and communicated to each other. The fixing base is provided with a conduction line. The light-emitting chip is disposed on the first fixing surface of the fixing base and electrically connected to one terminal of the conduction line. The optical element is disposed on the second fixing surface of the fixing base.

16 Claims, 3 Drawing Sheets

(51) Int. Cl.
*H01S 5/02326* (2021.01)
*H01S 5/0237* (2021.01)
*H01S 5/024* (2006.01)

(56) References Cited

U.S. PATENT DOCUMENTS

| | | | |
|---|---|---|---|
| 11,862,936 B2* | 1/2024 | Iwahama | G02B 3/00 |
| 2011/0156072 A1 | 6/2011 | Ling | |
| 2022/0052507 A1* | 2/2022 | Yang | H01S 5/06825 |

FOREIGN PATENT DOCUMENTS

| | | |
|---|---|---|
| CN | 108181777 A | 6/2018 |
| CN | 108344377 A | 7/2018 |
| CN | 108388022 A | 8/2018 |
| CN | 108649423 A | 10/2018 |
| CN | 108681094 A | 10/2018 |
| CN | 108879296 A | 11/2018 |
| CN | 208478823 U | 2/2019 |
| CN | 208569274 U | 3/2019 |
| CN | 208569286 U | 3/2019 |
| CN | 208580246 U | 3/2019 |
| CN | 109586165 A | 4/2019 |
| CN | 110190503 A | 8/2019 |
| WO | 2009/153446 A2 | 12/2009 |

OTHER PUBLICATIONS

Written Opinion of The International Searching Authority of International Application No. PCT/CN2020/082812 mailed on Jun. 28, 2020.
First Office Action of Priority Application No. CN 201910329862.1 mailed on Dec. 16, 2019.
The Second Office Action of Priority Application No. CN 201910329862.1 mailed on Aug. 18, 2020.
The Third Office Action of Priority Application No. CN 201910329862.1 mailed on Mar. 9, 2021.

* cited by examiner

FIXING BASE, LASER PROJECTION MODULE, AND ELECTRONIC DEVICE

CROSS REFERENCE TO RELATED APPLICATIONS

This application is a Bypass Continuation-in-Part Application of PCT/CN2020/082812 filed on Apr. 1, 2020, which claims priority to Chinese Patent Application No. 201910329862.1 filed on Apr. 23, 2019, which are incorporated herein by reference in their entirety.

TECHNICAL FIELD

The present disclosure relates to the field of imaging technologies, and in particular, to a fixing base, a laser projection module, and an electronic device.

BACKGROUND

A depth acquisition apparatus used in a current three-dimensional imaging recognition technology uses a light-emitting chip of a laser projection module to emit a laser beam with a small angle, and diffuses the laser beam into a uniform light surface or light spot with a large angle by using an optical element. An energy density of laser light is reduced after the diffusion, which avoids harm to a human body.

The optical element in the laser projection module is generally made of a glass and polymer material, thereby being thin and fragile. Once the optical element comes off or breaks due to insecure bonding, laser light emitted from the light-emitting chip directly irradiates the body or eyes of a human body, causing serious safety problems.

SUMMARY

According to a first aspect, the present disclosure provides a fixing base, applied to a laser projection module, where the fixing base has a first surface and a second surface that are disposed oppositely in a height direction of the fixing base; the second surface is a light-emitting surface; the fixing base includes a first accommodation cavity, a second accommodation cavity, and a third accommodation cavity that are sequentially distributed in a direction from the first surface to the second surface and communicated to each other; a projection area of the second accommodation cavity on the second surface is greater than a projection area of the third accommodation cavity on the second surface and is smaller than a projection area of the first accommodation cavity on the second surface; a first inner wall of the fixing base is connected to a second inner wall of the fixing base via a first fixing surface; the second inner wall is connected to a third inner wall of the fixing base via a second fixing surface; the first inner wall is formed by the first accommodation cavity in the fixing base; the second inner wall is formed by the second accommodation cavity in the fixing base; the third inner wall is formed by the third accommodation cavity in the fixing base; and the fixing base is provided with a conduction line.

According to a second aspect, the present disclosure further provides a laser projection module, including: a fixing base, having a first surface and a second surface that are disposed oppositely in a height direction of the fixing base, where the second surface is a light-emitting surface, the fixing base includes a first accommodation cavity, a second accommodation cavity, and a third accommodation cavity that are sequentially distributed in a direction from the first surface to the second surface and communicated to each other, a projection area of the second accommodation cavity on the second surface is greater than a projection area of the third accommodation cavity on the second surface and is smaller than a projection area of the first accommodation cavity on the second surface, a first inner wall of the fixing base is connected to a second inner wall of the fixing base via a first fixing surface, the second inner wall is connected to a third inner wall of the fixing base via a second fixing surface, the first inner wall is formed by the first accommodation cavity in the fixing base, the second inner wall is formed by the second accommodation cavity in the fixing base, the third inner wall is formed by the third accommodation cavity in the fixing base, and the fixing base is provided with a conduction line; a light-emitting chip, disposed on the first fixing surface of the fixing base and electrically connected to one terminal of the conduction line; and an optical element, disposed on the second fixing surface of the fixing base, where after passing through the optical element, laser light emitted by the light-emitting chip is projected out of the fixing base through the third accommodation cavity.

According to an aspect of the present disclosure, the shapes of orthogonal projections of the first accommodation cavity, the second accommodation cavity, and the third accommodation cavity on the second surface are square or circular.

According to an aspect of the present disclosure, the first surface of the fixing base is provided with an electrode or coated with an electrically conductive material.

According to an aspect of the present disclosure, the laser projection module further includes a substrate electrically connected to the first surface of the fixing base, and a surface of the substrate facing away from the fixing base is provided with an electrode or coated with an electrically conductive material.

According to an aspect of the present disclosure, one side of the light-emitting chip away from the first fixing surface is provided with a heat dissipation material or thermal conductive material.

According to an aspect of the present disclosure, a surface of the substrate facing the light-emitting chip is provided with a thermal pad extending towards the light-emitting chip; or a heat dissipation hole is formed in the substrate and filled with a thermal conductive material; or the substrate is a plate made of a thermal conductive material.

According to an aspect of the present disclosure, the light-emitting chip is welded on the first fixing surface of the fixing base by using a spherical solder or a copper pillar having a dome-shaped solder at the top.

According to an aspect of the present disclosure, the fixing base is a structural member made of a ceramic material or resin material; or the fixing base is a structural member made by embedding a metal frame into a ceramic material or resin material.

According to a third aspect, the present disclosure further provides an electronic device, including any one of the foregoing laser projection modules.

BRIEF DESCRIPTION OF DRAWINGS

The present disclosure can be better understood from the following descriptions of specific implementations of the present disclosure with reference to the accompanying drawings. Other features, purposes, and advantages of the present disclosure become more obvious by reading the following detailed descriptions of non-limiting embodiments with reference to the accompanying drawings. Same or similar reference numerals in the accompanying drawings represent same or similar features in the present disclosure.

Figure 1:
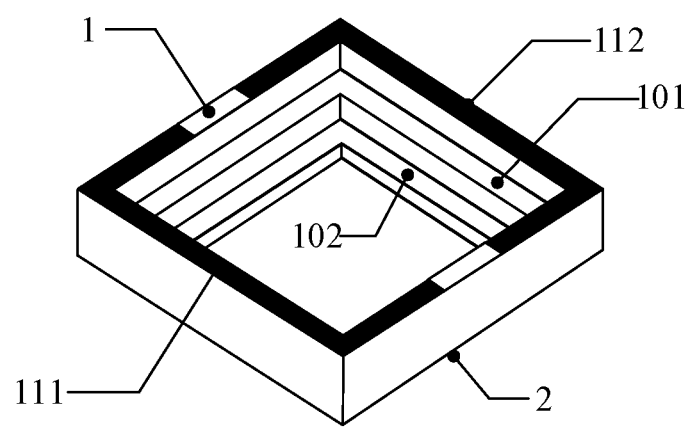
FIG. 1 is a schematic diagram of a spatial structure of a fixing base according to an embodiment of the present disclosure.

Reference numerals in the accompanying drawings are as follows:

- 10—Fixing base; 1—First surface; 2—Second surface; 11—First accommodation cavity; 113—First inner wall; 12—Second accommodation cavity; 121—Second inner wall; 13—Third accommodation cavity; 131—Third inner wall; 101—First fixing surface; 102—Second fixing surface; 111—First electrode; 112—Second electrode;
- 20—Light-emitting chip; 21—Heat dissipation material/Thermal conductive material; 23—Spherical solder; 24—Copper pillar; 30—Optical element;
- 40—Substrate; 401—Third electrode; 402—Fourth electrode; and 403—Thermal pad.

DESCRIPTION OF EMBODIMENTS

Characteristics and exemplary embodiments of various aspects of the present disclosure are described below in detail. In the following detailed descriptions, many specific details are provided to thoroughly understand the present disclosure. However, it is very clear to a person skilled in the art that the present disclosure can be implemented without some of these specific details. The following descriptions of the embodiments merely intend to provide examples of the present disclosure to better understand the present disclosure. The present disclosure is not limited to any specific configuration provided below, and instead covers any modification, replacement, and improvement of an element and a component without departing from the spirit of the present disclosure. In the accompanying drawings and the following descriptions, a well-known structure and technology are not shown to avoid unnecessary ambiguity of the present disclosure.

To better understand the present disclosure, a fixing base, a laser projection module, and an electronic device provided in the embodiments of the present disclosure will be described below in detail with reference to FIG. 1 to FIG. 5.

Figure 2:
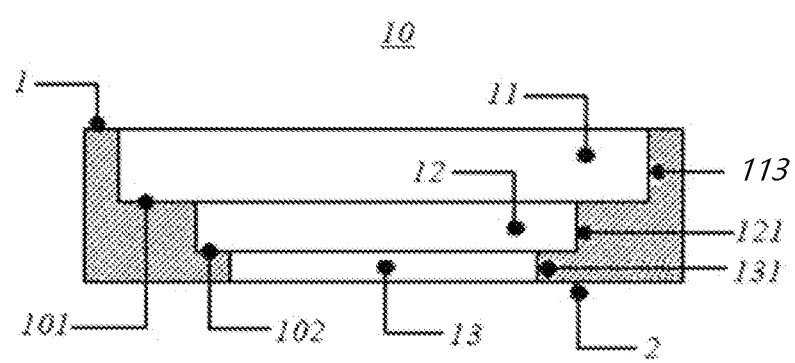
FIG. 2 is a schematic diagram of a longitudinal sectional structure of the fixing base shown in FIG. 1.

Referring to FIG. 1 and FIG. 2 together, an embodiment of the present disclosure provides a fixing base 10, applied to a laser projection module, where the fixing base 10 has a first surface 1 and a second surface 2 that are disposed oppositely in a height direction of the fixing base 10; the second surface 2 is a light-emitting surface; the fixing base 10 includes a first accommodation cavity 11, a second accommodation cavity 12, and a third accommodation cavity 13 that are sequentially distributed in a direction from the first surface 1 to the second surface 2 and communicated to each other; a projection area of the second accommodation cavity 12 on the second surface 2 is greater than a projection area of the third accommodation cavity 13 on the second surface 2 and is smaller than a projection area of the first accommodation cavity 11 on the second surface 2; a first inner wall 113 of the fixing base 10 is connected to a second inner wall 121 of the fixing base 10 via a first fixing surface 101; the second inner wall 121 is connected to a third inner wall 131 of the fixing base 10 via a second fixing surface 102; the first inner wall 113 is formed by the first accommodation cavity 11 in the fixing base 10; the second inner wall 121 is formed by the second accommodation cavity 12 in the fixing base 10; the third inner wall 131 is formed by the third accommodation cavity 13 in the fixing base 10; and the fixing base 10 is provided with a conduction line.

As an optional implementation, the fixing base 10 is a structural member made of a ceramic material or resin material, which is implemented, for example, by using an injection molding process. During injection molding, a copper sheet or copper wire constituting a circuit is laid and embedded into the fixing base 10.

As an optional implementation, the fixing base 10 is a structural member made by embedding a metal frame into a ceramic material or resin material, which is implemented, for example, by using an injection molding process. During injection molding, a copper sheet or copper wire constituting a circuit is laid and embedded into the fixing base 10, and the metal frame is embedded into the fixing base 10 at the same time. The metal frame can improve structural strength of the fixing base 10.

The conduction line can alternatively be laid on a surface of an inner wall of the fixing base and bonded onto the inner wall by using an adhesive. One terminal of the conduction line is connected to the light-emitting chip, and the other terminal of the conduction line extends out of the fixing base and is connected to an external circuit.

Figure 3:
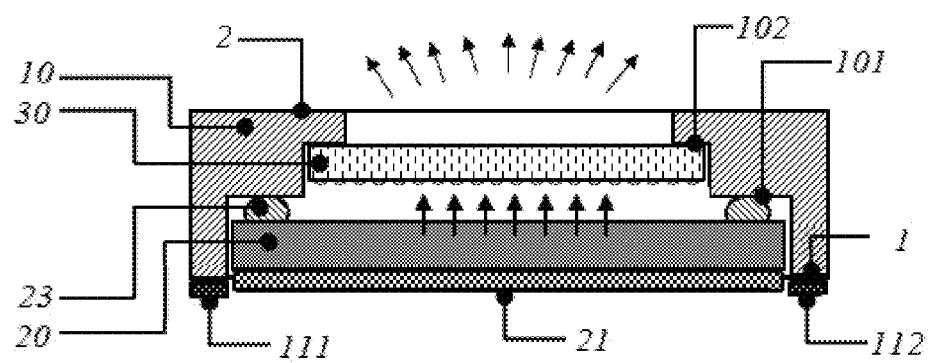
FIG. 3 is a schematic structural diagram of a laser projection module according to an embodiment of the present disclosure.

Referring to FIG. 1 to FIG. 3 together, an embodiment of the present disclosure further provides a laser projection module, including: a light-emitting chip 20, an optical element 30, and any one of the foregoing fixing bases 10.

The light-emitting chip 20 is disposed on the first fixing surface 101 of the fixing base 10 and is electrically connected to one terminal of the conduction line.

The light-emitting chip 20 may be an edge-emission laser chip such as a distributed feedback laser (DFB) chip. The DFB chip includes a single light source, or a plurality of DFB chips are arranged in an array to form a multi-point light source. The edge-emission laser chip has a low temperature drift, which can reduce an impact of temperature on a laser effect.

The light-emitting chip 20 may alternatively be a vertical cavity surface emitting laser (VCSEL) chip. The VCSEL chip includes a plurality of light sources arranged in an array. The VCSEL chip has a small height, helping reduce a height of the laser projection module, and facilitating integration of the laser projection module into an electronic device such as a mobile phone that has a higher thickness requirement.

The optical element 30 is disposed on the second fixing surface 102 of the fixing base 10, for example, may be attached onto the second fixing surface 102 by using a fixing glue. After passing through the optical element 30, laser light emitted by the light-emitting chip 20 is projected out of the fixing base 10 through the third accommodation cavity 13 of the fixing base 10.

As described above, the second surface 2 of the fixing base 10 is a light-emitting surface. The optical element 30 is attached into the inverted fixing base 10, thereby being not easy to get loose due to an external collision. Even if the optical element 30 gets loose, the optical element 30 can still be stuck inside the fixing base 10 instead of coming off, thereby preventing laser light emitted by the light-emitting chip 20 from directly irradiating a human body to cause harm. In addition, an additional protective cover does not need to be disposed on an outer side of the optical element 30 of the laser projection module, which reduces an overall height of the laser projection module.

In some embodiments, the optical element 30 may be a diffuser. After passing through the diffuser and being diffused by the diffuser, laser light emitted by the light-emitting chip 20 is projected out through the third accommodation cavity 13 of the fixing base 10, for example, projected into a target space to form a laser pattern.

In some embodiments, the optical element 30 includes a diffractive element accommodated in the fixing base 10, and optionally further includes a collimating element. The collimating element is disposed between the light-emitting chip 20 and the diffractive element and is configured to collimate laser light passing through the collimating element. The diffractive element is configured to project laser light collimated by the collimating element out through the third accommodation cavity 13 of the fixing base 10, to form a laser pattern.

Further, the shapes of orthogonal projections of the first accommodation cavity 11, the second accommodation cavity 12, and the third accommodation cavity 13 on the second surface are square or circular. Depth dimensions of the first accommodation cavity 11, the second accommodation cavity 12, and the third accommodation cavity 13 are determined according to specific types of the light-emitting chip 20 and the optical element 30. Details are not described herein again.

According to the laser projection module provided in this embodiment of the present disclosure, the optical element 30 and the light-emitting chip 20 are disposed in the inverted fixing base 10, which can prevent the optical element 30 from coming off from the fixing base 10, thereby preventing laser light emitted by the light-emitting chip 20 from directly irradiating a human body to cause harm, and improving safety of the laser projection module.

Referring to FIG. 1 to FIG. 3 again, the light-emitting chip 20 is welded on the first fixing surface 101 of the fixing base 10 by using a spherical solder 23. In comparison with a connection manner of wire bonding for the light-emitting chip 20, a manufacture cost can be reduced. In addition, an overall dimension of the laser projection module can be reduced, making a structure more compact.

The light-emitting chip 20 has higher heat productivity. Therefore, to facilitate heat dissipation, one side of the light-emitting chip 20 away from the first fixing surface 101 is provided with a heat dissipation material 21, for example, coated with a heat dissipation adhesive. Heat generated by the light-emitting chip 20 can be dissipated through the heat dissipation material 21, preventing the laser projection module from overheating.

In some embodiments, the first surface 1 of the fixing base 10 is provided with an electrode or coated with an electrically conductive material. The electrode includes a first electrode 111 and a second electrode 112 that are distributed on the first surface 1 at an interval. The laser projection module is electrically connected to the outside via the electrode or the electrically conductive material.

The laser projection module is structurally the weakest at a position where the first surface 1 of the fixing base 10 is connected to a peripheral component. When the laser projection module is impacted by an external force, damage first occurs at a position where the first surface 1 is electrically connected to the outside. Once damage occurs at the position, a circuit of the light-emitting chip 20 is damaged. Consequently, the light-emitting chip 20 stops working and does not emit laser light, further improving the safety of the laser projection module.

Figure 4:
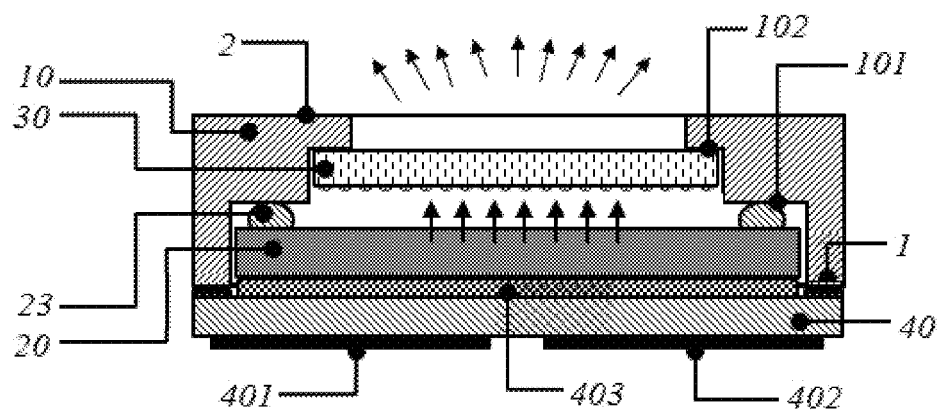
FIG. 4 is a schematic structural diagram of another laser projection module according to an embodiment of the present disclosure.

Referring to FIG. 4, an embodiment of the present disclosure further provides a laser projection module, which has a structure similar to the laser projection module shown in FIG. 3. A difference lies in that the laser projection module in this embodiment further includes a substrate 40 electrically connected to the first surface 1 of the fixing base 10. A surface of the substrate 40 facing away from the fixing base 10 is provided with an electrode or coated with an electrically conductive material. The electrode includes a third electrode 401 and a fourth electrode 402 that are distributed on the substrate 40 at an interval. The laser projection module is electrically connected to the outside via the electrode or the electrically conductive material.

The first surface 1 of the fixing base 10 may be welded together with the substrate 40 by using, for example, solder paste. The substrate 40 is connected to the light-emitting chip 20 via a circuit laid in the fixing base 10, so that the light-emitting chip 20 can emit laser light. The light-emitting chip 20 has higher heat productivity. To facilitate heat dissipation, optionally, a surface of the substrate 40 facing the light-emitting chip 20 is provided with a thermal pad 403 extending towards the light-emitting chip 20. The thermal pad 403 is tightly attached to the light-emitting chip 20, so that heat generated by the light-emitting chip 20 can be conducted outside via the substrate 40.

Optionally, one side of the light-emitting chip 20 away from the first fixing surface 101 is provided with a thermal conductive material 21, for example, a thermal conductive adhesive or thermal conductive pad. Heat generated by the light-emitting chip 20 is dissipated via the thermal conductive adhesive or the thermal conductive pad.

Optionally, the substrate 40 is a plate made of a thermal conductive material. Therefore, the substrate 40 not only can be applied to a bearer circuit, but also can dissipate heat of the light-emitting chip 20, thereby improving service life of the laser projection module. The thermal conductive material may be a ceramic material, or may be a metallic material, for example, aluminum, gold, copper, silver, or the like. Therefore, high heat conductivity of thermal conductive materials such as the ceramic material, the metallic material, and the like can be fully utilized to dissipate heat of the light-emitting chip 20.

In some embodiments, the substrate 40 may alternatively be made of plastic, for example, at least one of: polyethylene glycol terephthalate (PET), polymethyl methacrylate (PMMA), polycarbonate (PC), and polyimide (PI). Therefore, the substrate 40 has a small weight but sufficient support strength.

Optionally, one or more heat dissipation holes are formed in the substrate 40 and filled with a thermal conductive material. The heat dissipation hole may be circular, rectangular, or the like. The heat dissipation holes may be arranged in an array on the substrate 40, or may be arranged densely at a position close to the light-emitting chip 20. The heat dissipation hole is filled with a thermal conductive material (for example, thermal silicone grease, a metallic material, or the like) to enhance a thermal conduction effect.

When the substrate 40 is made of ceramic and the foregoing heat dissipation hole is formed in the substrate 40, the heat dissipation hole is filled with thermal silicone grease or a metallic material (for example, silver, copper, gold, or the like) to dissipate heat. When the substrate 40 is made of a metallic material and the foregoing heat dissipation hole is formed in the substrate 40, the heat dissipation hole is filled with metal with higher thermal conductivity than the metallic material. For example, when the substrate 40 is made of aluminum, the heat dissipation hole is filled with copper. For another example, when the substrate 40 is made of copper, the heat dissipation hole is filled with gold. In this way, the thermal conductivity of the substrate 40 may be improved, and a cost of the substrate 40 may be reduced. When the substrate 40 is made of plastic and the foregoing heat dissipation hole is formed in the substrate 40, the heat dissipation hole is filled with thermal silicone grease or a metallic material. In this case, the substrate 40 provides not only a support function but also a heat dissipation function, and the substrate 40 is light.

In addition, the laser projection module is structurally the weakest at a position where the first surface 1 of the fixing base 10 is electrically connected to the substrate 40 or at a position where the electrode of the substrate 40 is electrically connected to the outside. When the laser projection module is impacted by an external force, damage first occurs at the position where the first surface 1 is electrically connected to the substrate 40 or at the position where the electrode of the substrate 40 is electrically connected to the outside. No matter the damage occurs at which of the positions, a circuit of the light-emitting chip 20 is damaged. Consequently, the light-emitting chip 20 stops working and does not emit laser light, further improving safety of the laser projection module.

Figure 5:
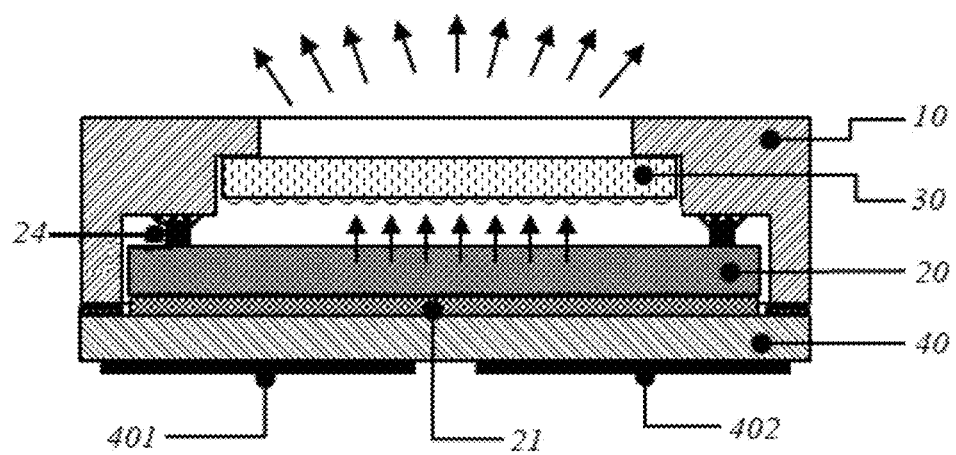
FIG. 5 is a schematic structural diagram of still another laser projection module according to an embodiment of the present disclosure.

Referring to FIG. 5, the light-emitting chip 20 of any one of the foregoing laser projection modules according to the embodiments of the present disclosure can be welded on the first fixing surface 101 of the fixing base 10 by using a copper pillar 24 having a dome-shaped solder at the top. When the copper pillar 24 is used, more external electrical connection points can be arranged on the light-emitting chip 20 with a smaller size, and welding spots can be arranged more densely in a unit area, thereby obtaining a laser projection module with higher integration, smaller crosstalk interference, and lower noise.

In addition, an embodiment of the present disclosure further provides an electronic device, including any one of the foregoing laser projection modules. The electronic device may be a mobile phone, a tablet computer, a portable computer, a game console, a head mounted display device, an access control system, a teller's machine, or the like.

It should be understood by a person skilled in the art that the foregoing embodiments are merely exemplary rather than restrictive. Different technical features in different embodiments may be combined to achieve beneficial effects. On the basis of studying the accompanying drawings, the specifications, and the claims, a person skilled in the art, shall be able to understand and implement other modified embodiments of the disclosed embodiments. In the claims, the term "comprise" does not exclude other apparatuses or steps; when an article is not modified with a quantifier, it is intended to include one/one type or multiple/multiple types of articles, and can be used interchangeably with "one/one type or multiple/multiple types of articles"; and the terms "first" and "second" are used to indicate names rather than to indicate any particular order. None of the reference signs in the claims shall be construed as limiting the protection scope. The functions of the multiple parts appearing in the claims may be implemented by a single hardware or software module. The appearance of certain technical features in different dependent claims does not mean that these technical features cannot be combined to achieve beneficial effects.

What is claimed is:

1. A laser projection module, comprising:
    a fixing base having a first surface and a second surface that are disposed oppositely in a height direction of the fixing base, wherein the second surface is a light-emitting surface, the fixing base has a first accommodation cavity, a second accommodation cavity, and a third accommodation cavity that are sequentially distributed in a direction from the first surface to the second surface and communicated to each other, a projection area of the second accommodation cavity on the second surface is greater than a projection area of the third accommodation cavity on the second surface and is smaller than a projection area of the first accommodation cavity on the second surface, a first inner wall of the fixing base is connected to a second inner wall of the fixing base via a first fixing surface, the second inner wall is connected to a third inner wall of the fixing base via a second fixing surface, the first inner wall is formed by the first accommodation cavity in the fixing base, the second inner wall is formed by the second accommodation cavity in the fixing base, the third inner wall is formed by the third accommodation cavity in the fixing base, and the fixing base is provided with a conduction line;
    a light-emitting chip disposed on the first fixing surface of the fixing base and electrically connected to one terminal of the conduction line; and
    an optical element disposed on the second fixing surface of the fixing base, wherein after passing through the optical element, laser light emitted by the light-emitting chip is projected out of the fixing base through the third accommodation cavity; wherein
    the first surface of the fixing base is provided with an electrode or coated with an electrically conductive material, and the laser projection module is electrically connected to outside via the electrode or the electrically conductive material.

2. The laser projection module according to claim 1, wherein shapes of orthogonal projections of the first accommodation cavity, the second accommodation cavity, and the third accommodation cavity on the second surface are square or circular.

3. The laser projection module according to claim 1, wherein the laser projection module further comprises a substrate electrically connected to the first surface of the fixing base, and a surface of the substrate facing away from the fixing base is provided with an electrode or coated with an electrically conductive material.

4. The laser projection module according to claim 1, wherein one side of the light-emitting chip away from the first fixing surface is provided with a heat dissipation material or a thermal conductive material.

5. The laser projection module according to claim 3, wherein a surface of the substrate facing the light-emitting chip is provided with a thermal pad extending towards the light-emitting chip; or a heat dissipation hole is formed in the substrate and filled with a thermal conductive material; or the substrate is a plate made of a thermal conductive material.

6. The laser projection module according to claim 1, wherein the light-emitting chip is welded on the first fixing surface of the fixing base by using a spherical solder or a copper pillar having a dome-shaped solder at the top.

7. The laser projection module according to claim 1, wherein the fixing base is a structural member made of a ceramic material or a resin material; or the fixing base is a structural member made by embedding a metal frame into a ceramic material or a resin material.

8. A fixing base, applied to a laser projection module, wherein the fixing base has a first surface and a second surface that are disposed oppositely in a height direction of the fixing base; the second surface is a light-emitting surface; the fixing base has a first accommodation cavity, a second accommodation cavity, and a third accommodation cavity that are sequentially distributed in a direction from the first surface to the second surface and communicated to each other; a projection area of the second accommodation cavity on the second surface is greater than a projection area of the third accommodation cavity on the second surface and is smaller than a projection area of the first accommodation cavity on the second surface; a first inner wall of the fixing base is connected to a second inner wall of the fixing base via a first fixing surface; the second inner wall is connected to a third inner wall of the fixing base via a second fixing surface; the first inner wall is formed by the first accommodation cavity in the fixing base; the second inner wall is formed by the second accommodation cavity in the fixing base; the third inner wall is formed by the third accommodation cavity in the fixing base; and the fixing base is provided with a conduction line; wherein the first surface of the fixing base is provided with an electrode or coated with an electrically conductive material, and the laser projection module is electrically connected to outside via the electrode or the electrically conductive material.

9. The fixing base according to claim 8, wherein shapes of orthogonal projections of the first accommodation cavity, the second accommodation cavity, and the third accommodation cavity on the second surface are square or circular.

10. An electronic device, comprising a laser projection module, wherein the electronic device comprises:

a fixing base having a first surface and a second surface that are disposed oppositely in a height direction of the fixing base, wherein the second surface is a light-emitting surface, the fixing base has a first accommodation cavity, a second accommodation cavity, and a third accommodation cavity that are sequentially distributed in a direction from the first surface to the second surface and communicated to each other, a projection area of the second accommodation cavity on the second surface is greater than a projection area of the third accommodation cavity on the second surface and is smaller than a projection area of the first accommodation cavity on the second surface, a first inner wall of the fixing base is connected to a second inner wall of the fixing base via a first fixing surface, the second inner wall is connected to a third inner wall of the fixing base via a second fixing surface, the first inner wall is formed by the first accommodation cavity in the fixing base, the second inner wall is formed by the second accommodation cavity in the fixing base, the third inner wall is formed by the third accommodation cavity in the fixing base, and the fixing base is provided with a conduction line;

a light-emitting chip, disposed on the first fixing surface of the fixing base and electrically connected to one terminal of the conduction line; and an optical element, disposed on the second fixing surface of the fixing base, wherein after passing through the optical element, laser light emitted by the light-emitting chip is projected out of the fixing base through the third accommodation cavity; wherein the first surface of the fixing base is provided with an electrode or coated with an electrically conductive material, and the laser projection module is electrically connected to outside via the electrode or the electrically conductive material.

11. The electronic device according to claim 10, wherein shapes of orthogonal projections of the first accommodation cavity, the second accommodation cavity, and the third accommodation cavity on the second surface are square or circular.

12. The electronic device according to claim 10, wherein the laser projection module further comprises a substrate electrically connected to the first surface of the fixing base, and a surface of the substrate facing away from the fixing base is provided with an electrode or coated with an electrically conductive material.

13. The electronic device according to claim 10, wherein one side of the light-emitting chip away from the first fixing surface is provided with a heat dissipation material or a thermal conductive material.

14. The electronic device according to claim 12, wherein a surface of the substrate facing the light-emitting chip is provided with a thermal pad extending towards the light-emitting chip; or a heat dissipation hole is formed in the substrate and filled with a thermal conductive material; or the substrate is a plate made of a thermal conductive material.

15. The electronic device according to claim 10, wherein the light-emitting chip is welded on the first fixing surface of the fixing base by using a spherical solder or a copper pillar having a dome-shaped solder at the top.

16. The electronic device according to claim 10, wherein the fixing base is a structural member made of a ceramic material or a resin material; or the fixing base is a structural member made by embedding a metal frame into a ceramic material or a resin material.

* * * * *